(12) United States Patent
Lee et al.

(10) Patent No.: US 6,621,359 B2
(45) Date of Patent: Sep. 16, 2003

(54) NOISE ELIMINATION CIRCUIT

(75) Inventors: Sang Yoon Lee, Seoul (KR); Jai Youn Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 47 days.

(21) Appl. No.: 10/034,562

(22) Filed: Dec. 27, 2001

(65) Prior Publication Data

US 2002/0145476 A1 Oct. 10, 2002

(30) Foreign Application Priority Data

Apr. 4, 2001 (KR) ................. 10-2001-0017931

(51) Int. Cl.[7] ............................. H03B 27/00; H03B 5/24
(52) U.S. Cl. ..................... 331/57; 331/173; 327/551
(58) Field of Search ........................ 331/57, 74, 173, 331/175, 75; 327/165, 379, 387, 551; 375/285, 346

(56) References Cited

U.S. PATENT DOCUMENTS

| 5,197,082 A | * | 3/1993 | Uda et al. ............... 375/214 |
| 5,282,223 A | * | 1/1994 | Muramatsu ............. 375/214 |
| 5,479,129 A | * | 12/1995 | Fernandez et al. ...... 327/276 |
| 5,572,549 A | | 11/1996 | Shimomoura et al. |

FOREIGN PATENT DOCUMENTS

JP        59092619        5/1984

* cited by examiner

*Primary Examiner*—David C. Mis
(74) *Attorney, Agent, or Firm*—Ladas & Parry

(57) ABSTRACT

A noise elimination circuit which can eliminate all noise of a reset signal of a microprocessor or an input signal effective in a specific logic level comprises: a ring oscillator unit for receiving first and second signals and generating a pulse signal according to the first signal, and stopping generation of the pulse signal when the first and the second signals have a first potential level; and a frequency division unit for receiving an output signal of the ring oscillator unit and then, N times frequency-dividing to generate the signal to the second signal, and being reset by the first signal.

11 Claims, 7 Drawing Sheets

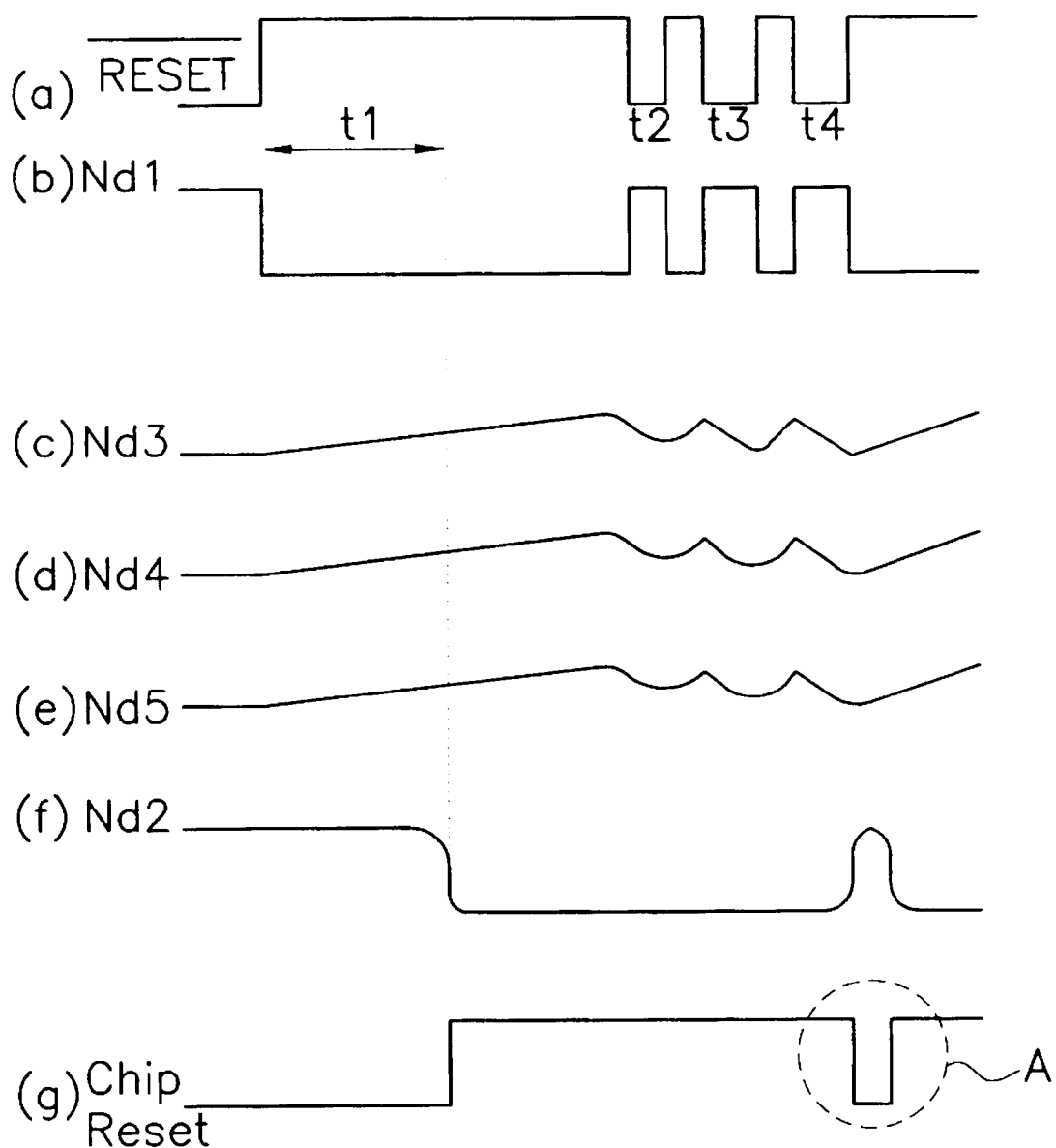

NOISE ELIMINATION CIRCUIT

BACKGROUND OF THE INVENTION

1. Field of the Invention

The present invention relates generally to a noise elimination circuit, and in particular, to an improved noise elimination circuit which can eliminate all noise of a reset signal of a microprocessor or an input signal effective in a specific logic level.

2. Description of the Background Art

FIG. 1 is a circuit diagram illustrating a conventional noise elimination circuit.

Referring to FIG. 1, the conventional noise elimination circuit includes: an inverter INV1 receiving a reset bar signal /RESET, and outputting an inverted signal to a node Nd1; a noise elimination unit 10 receiving the signal transmitted to the node Nd1, for eliminating noise of the signal, and outputting the resultant signal to a node Nd2; a NOR gate NOR1 NORing the signals of the nodes Nd1, Nd2; an AND gate AND1 ANDing the signals of the nodes Nd1, Nd2; and an RS latch circuit unit 12 receiving the output signal from the NOR gate NOR1 as a set signal and the output signal from the AND gate AND1 as a reset signal, and generating a chip reset signal to an output terminal Q.

In the conventional noise elimination circuit, when the reset bar signal /RESET is enabled in a low level, the signal of the node Nd1 is transited to a high level by the inverter INV1. The signal of the node Nd1 (high) outputs a high level signal to the node Nd2 through the noise elimination unit 10 after a delay time t1. Accordingly, the reset input of the RS latch circuit unit 12 is enabled in a high level, thus clearing the RS latch circuit unit 12.

Here, the noise elimination unit 10 eliminates noise of the reset bar signal /RESET, so that an unwanted chip reset signal cannot be generated due to noise in the signal.

FIG. 2A is a circuit diagram illustrating a noise elimination unit using the R-C delay shown in FIG. 1, and FIG. 2B is a circuit diagram illustrating a noise elimination unit using an inverter and capacitor delay shown in FIG. 1.

As illustrated in FIG. 2A, the conventional noise elimination unit 10 includes: an inverter INV2 and a resistor R1 connected in series between the nodes Nd1, Nd3; a capacitor C1 connected between the node Nd3 and the ground voltage Vss; a resistor R2 connected between the nodes Nd3, Nd4; a capacitor C2 connected between the node Nd4 and the ground voltage Vss; a resistor R3 connected between the nodes Nd4, Nd5; a capacitor C3 connected between the node Nd5 and the ground voltage Vss; and an inverter INV3 connected between the nodes Nd5, Nd2.

As depicted in FIG. 2B, the conventional noise elimination unit 10 using the inverter and capacitor delay includes: an inverter INV4 connected between the nodes Nd1, Nd6; a capacitor C4 connected between the node Nd6 and the ground voltage Vss; an inverter INV5 connected between the nodes Nd6, Nd7; a capacitor C5 connected between the node Nd7 and the ground voltage Vss; an inverter INV6 connected between the nodes Nd7, Nd8; a capacitor C6 connected between the node Nd8 and the ground voltage Vss; and an inverter INV7 connected between the nodes Nd8, Nd2.

The operation of the conventional noise elimination unit 10 will now be explained.

When the signal of the node Nd1 is inputted to the noise elimination unit 10, the signal is outputted to the node Nd2 without noise after a predetermined delay time t1 in the noise elimination unit 10. That is, when the signal of the node Nd1 has a smaller noise period than the delay time t1, the noise elimination unit 10 filters the signal to prevent influence of the noise on the signal of the node Nd2.

Accordingly, the reset input signal of the RS latch circuit unit 12 (FIG. 1) has a low level, and thus the output signal Q is maintained as it is.

However, the conventional noise elimination circuit has a disadvantage in that when noise is consecutively generated before the delay time, the noise elimination unit does not successfully eliminate noise.

The problem of the conventional noise elimination circuit will now be explained with reference to FIGS. 3A and 3B.

Referring to FIG. 3A, when noise t2–t4 is consecutively inputted to the reset bar signal /RESET after the delay time t1, the signals of the nodes Nd3, Nd4, Nd5 of the noise elimination unit 10 gradually reduce the corresponding potential levels. As shown in FIG. 3A(f), the signal outputted to the node Nd2 through the inverter INV3 has an undesirable high level, as shown by the spike.

The high level signal of the node Nd2 converts the reset input signal of the RS latch circuit unit 12 into a high level signal, and thus converts the output signal Q into a high level signal. That is, the chip reset signal is generated due to unwanted noise, which causes a mis-operation of the circuit.

As illustrated in FIG. 3B, when noise t5–t6 is consecutively inputted to the reset bar signal /RESET after the delay time t1, the signals of the nodes Nd6, Nd7, Nd8 of the noise elimination unit 10 gradually reduce the corresponding potential levels. As shown in FIG. 3B(f), the signal outputted to the node Nd2 through the inverter INV7 has an undesirable high level.

The high level signal of the node Nd2 converts the reset input signal of the RS latch circuit unit 12 into a high level signal. Therefore, the chip reset signal is generated due to unwanted noise, thereby causing a mis-operation of the circuit.

SUMMARY OF THE INVENTION

Accordingly, it is an object of the present invention to provide a noise elimination circuit that can eliminate all noise of a reset signal of a microprocessor or an input signal effective in a specific logic level, by varying a filtering time through a ring oscillator and a frequency division circuit.

In order to achieve the above-described object of the present invention, there is provided a noise elimination circuit including: a ring oscillator unit for receiving first and second signals and generating a pulse signal according to the first signal, and stopping generation of the pulse signal when the first and the second signals have a first potential level; and a frequency division unit for receiving an output signal of the ring oscillator unit and then, N times frequency-dividing to generate the signal to the second signal, and being reset by the first signal. When the first potential is at a logic high level, and the second potential is at a logic low level. Conversely, when the first potential is at a logic low level, and the second potential is at a logic high level.

Preferably, the ring oscillator unit includes: a third inverter for inverting a signal of the first node, and outputting the inverted signal to a third node; an OR gate for ORing the signals of the third node and the second node, and outputting the resultant signal to a fourth node; a fourth inverter for inverting a signal of a fifth node according to the signal of the fourth node; a resistor connected between the output terminal of the fourth inverter and a sixth node; fifth and sixth inverters connected in series between the sixth node and the fifth node; a capacitor connected between the fifth node and the sixth node; an NMOS transistor for discharging a signal of the sixth node into the ground voltage according to the signal of the fourth node; and seventh and eight inverters connected in series between the fifth node and the seventh node.

In addition, the frequency division of the frequency division circuit unit is dependent upon the structure and design of the ring oscillator unit.

According to another aspect of the present invention, a noise elimination circuit includes: a first inverter receiving a reset bar signal, and outputting an inverted signal to a first node; a noise elimination unit receiving the signal of the first node, eliminating all noise of the signal, and outputting the resultant signal to a second node; a second inverter inverting the signal of the first node; an AND gate ANDing the signal of the first node and the signal of the second node; and an RS latch circuit unit receiving the output signal from the second inverter as a set signal and the output signal from the AND gate as a reset signal, and generating a chip reset signal to an output terminal.

Preferably, the noise elimination unit includes: a ring oscillator unit generating a pulse signal having a predetermined period when the signal of the first node is at a first potential, stopping the operation and clearing an output signal thereof, when the signal of the second node is at the first potential; and a frequency division circuit unit frequency-dividing the output signal from the ring oscillator unit, outputting the frequency-divided signal to the second node, and being reset when the signal of the first node is at the second potential. When the first potential is at a logic high level, and the second potential is at a logic low level. Conversely, when the first potential is at a logic low level, and the second potential is at a logic high level.

Preferably, the ring oscillator unit includes: a third inverter for inverting a signal of the first node, and outputting the inverted signal to a third node; an OR gate for ORing the signals of the third node and the second node, and outputting the resultant signal to a fourth node; a fourth inverter for inverting a signal of a fifth node according to the signal of the fourth node; a resistor connected between the output terminal of the fourth inverter and a sixth node; fifth and sixth inverters connected in series between the sixth node and the fifth node; a capacitor connected between the fifth node and the sixth node; an NMOS transistor for discharging a signal of the sixth node into the ground voltage according to the signal of the fourth node; and seventh and eight inverters connected in series between the fifth node and the seventh node.

The frequency division of the frequency division circuit unit is dependent upon the design of the ring oscillator unit.

BRIEF DESCRIPTION OF THE DRAWINGS

The present invention will become better understood with reference to the accompanying drawings which are given only by way of illustration and thus are not limitative of the present invention, wherein:

FIG. 3A is an operation timing diagram of the conventional noise elimination circuit using the R-C delay of FIG. 1;

DETAILED DESCRIPTION OF THE PREFERRED EMBODIMENTS

A noise elimination circuit in accordance with a preferred embodiment of the present invention will now be described in detail with reference to the accompanying drawing FIGS. 4–6.

Figure 1:
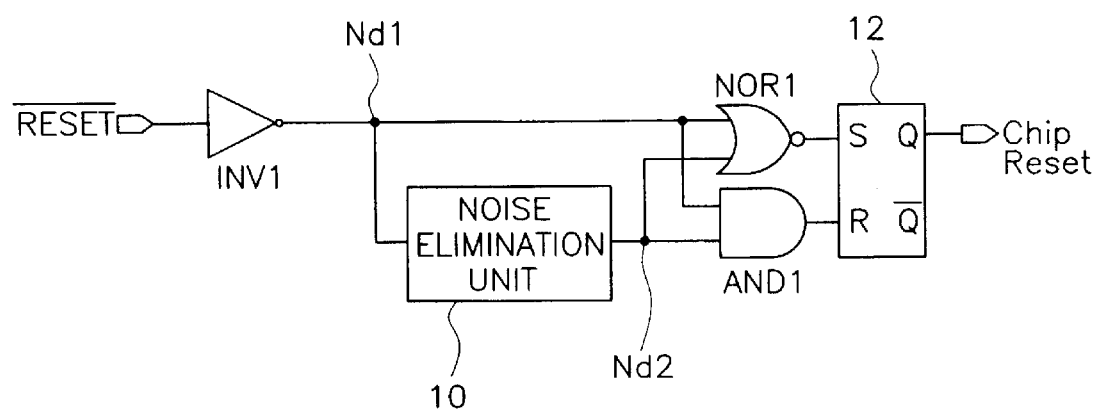
FIG. 1 is a circuit diagram illustrating a conventional noise elimination circuit.
Figure 2A:
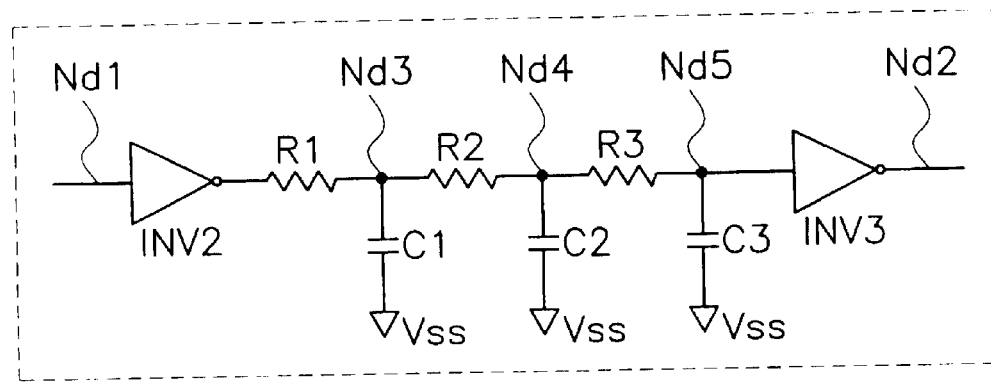
FIG. 2A is a circuit diagram illustrating the conventional noise elimination unit using an R-C delay of FIG. 1.
Figure 2B:
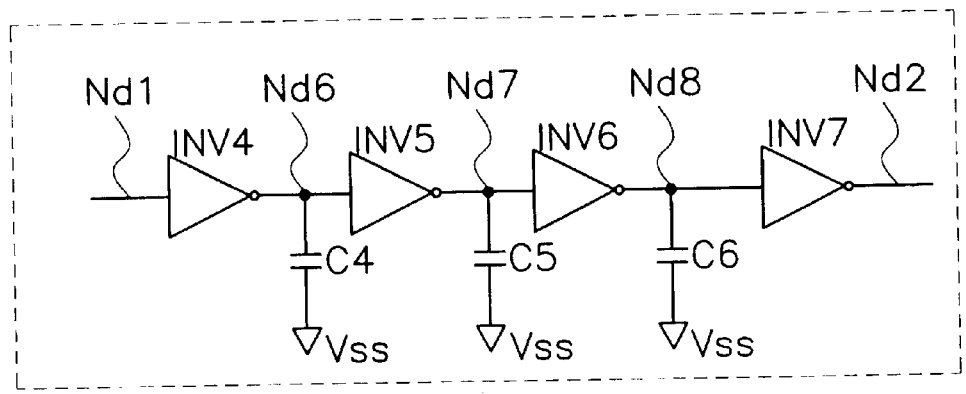
FIG. 2B is a circuit diagram illustrating the conventional noise elimination unit using an inverter and capacitor delay of FIG. 1.
Figure 3B:
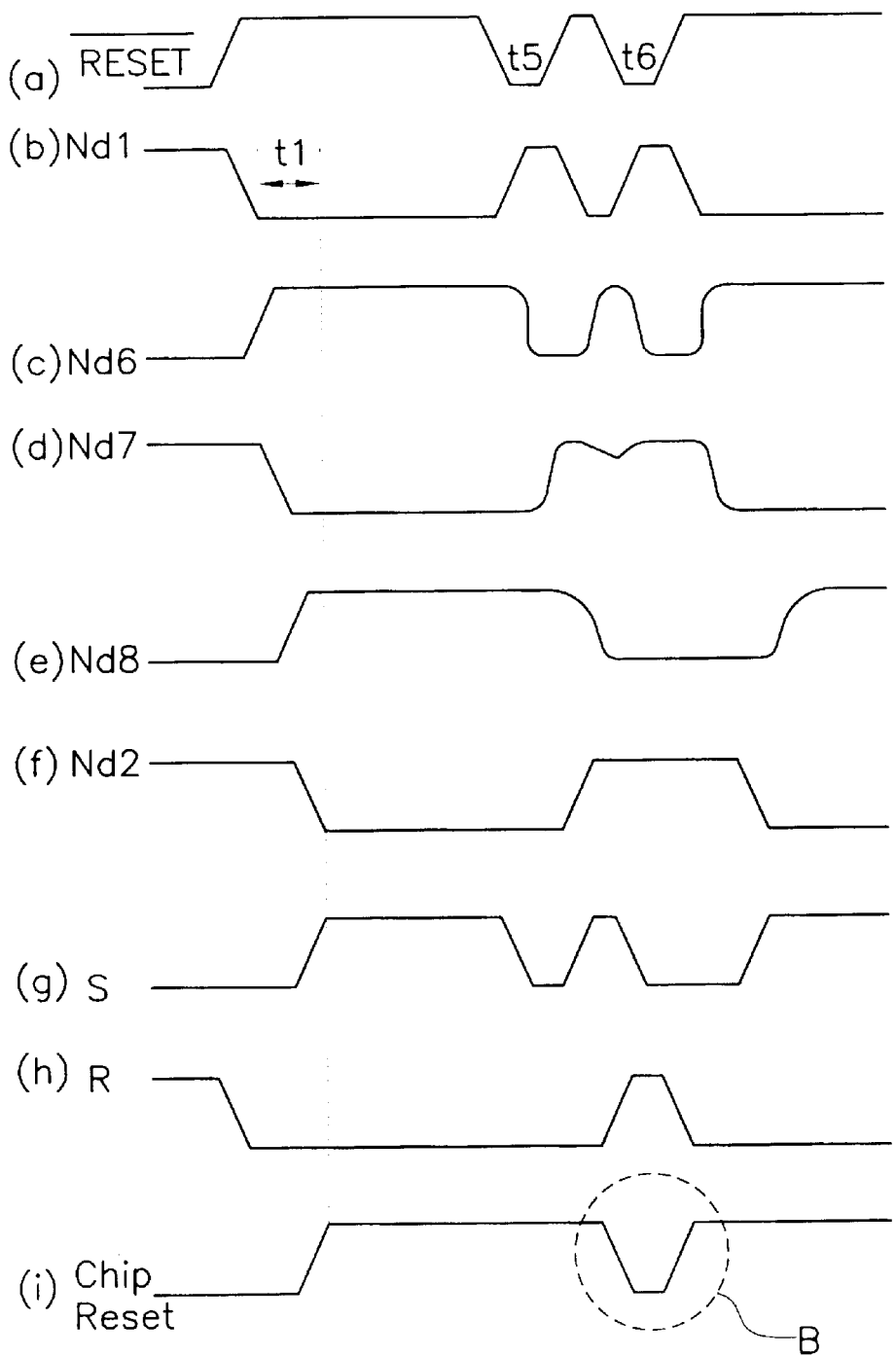
FIG. 3B is an operation timing diagram of the conventional noise elimination circuit using the inverter and capacitor delay of FIG. 1.
Figure 4:
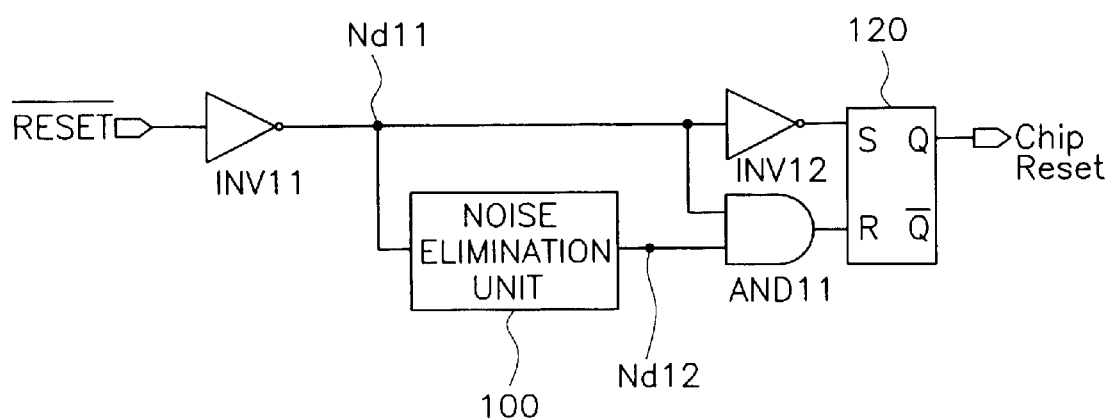
FIG. 4 is a circuit diagram illustrating a noise elimination circuit in accordance with a preferred embodiment of the present invention.
Figure 5:
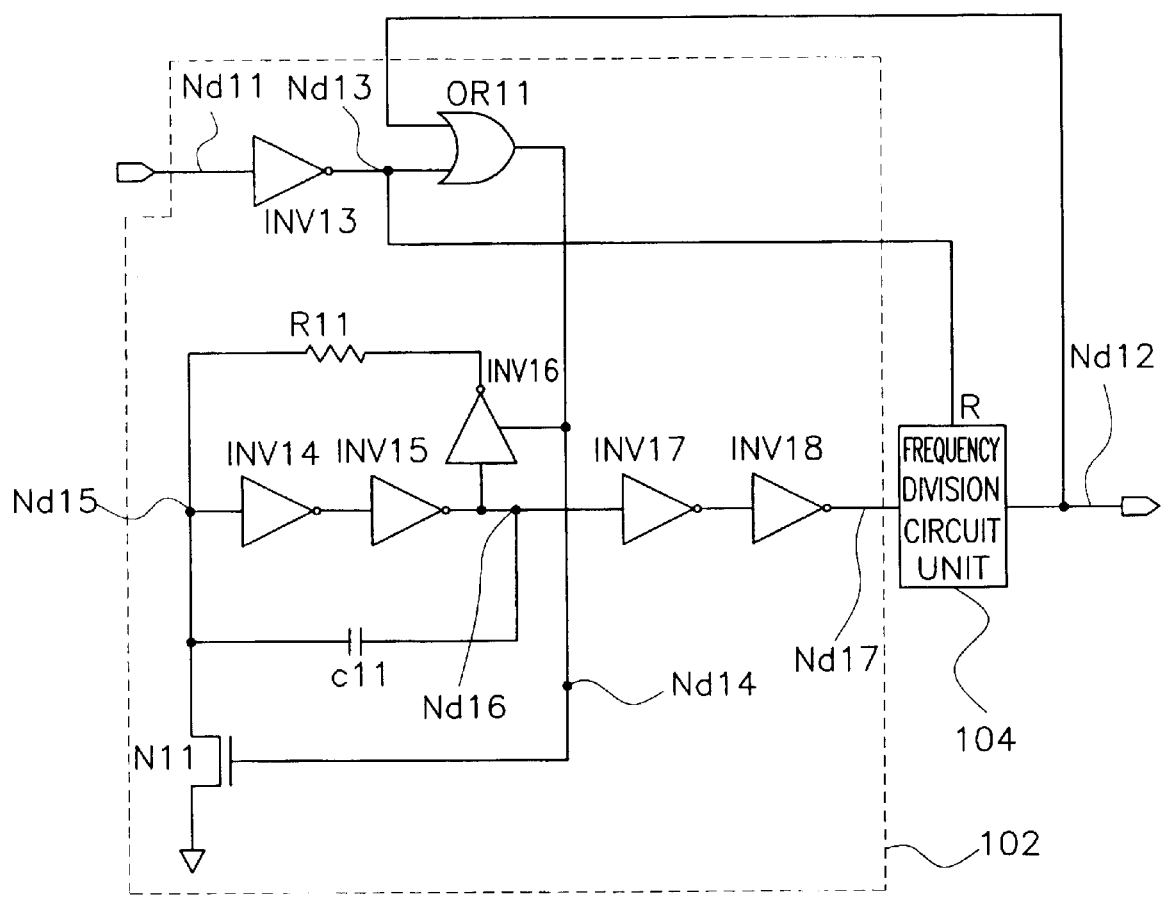
FIG. 5 is a detailed circuit diagram illustrating the noise elimination unit shown in FIG. 4.

FIG. 4 is a circuit diagram illustrating the noise elimination circuit in accordance with the preferred embodiment of the present invention, and FIG. 5 is a detailed circuit diagram illustrating the noise elimination unit shown in FIG. 4.

Referring to FIG. 4, the noise elimination circuit includes: an inverter INV11 receiving a reset bar signal /RESET, and outputting an inverted signal to a node Nd11; a noise elimination unit 100 receiving the signal transmitted to the node Nd11, eliminating the noise of the signal, and outputting the resultant signal to a node Nd12; an inverter INV12 inverting the signal of the node Nd11; an AND gate AND11 ANDing the signals of the nodes Nd11, Nd12; and an RS latch circuit unit 120 receiving the output signal from the inverter INV12 as a set signal and the output signal from the AND gate AND11 as a reset signal, and generating a chip reset signal to an output terminal Q.

Here, the noise elimination unit 100 eliminates noise of the reset bar signal /RESET.

As illustrated in FIG. 5, the noise elimination unit 100 includes: a ring oscillator unit 102 for generating a pulse signal having a predetermined period when the signal of the node Nd11, which is an input signal, has a high level, stopping the operation when the signal of the node Nd12, which is an output signal, is enabled at a high level, and clearing a signal at its output terminal Nd17; and a frequency division circuit unit 104 frequency-dividing the output signal from the ring oscillator unit 102, outputting the frequency-divided signal to the node Nd12, and being reset when the signal of the node Nd11 has a low level. Here, the frequency division of the frequency division circuit unit 104 is dependent upon the design of the ring oscillator unit 102.

The ring oscillator unit 102 includes: an inverter INV13 for inverting a signal of the node Nd11, and outputting the inverted signal to a node Nd13; an OR gate OR11 for ORing the signals of the nodes Nd13, Nd12, and outputting the resultant signal to a node Nd14; an inverter INV16 for inverting a signal of a node Nd16 according to the signal of the node Nd14; a resistor R11 connected between the output terminal of the inverter INV16 and a node Nd15; inverters INV14, INV15 connected in series between the nodes Nd15, Nd16; a capacitor C11 connected between the nodes Nd16, Nd15; an NMOS transistor N11 for discharging a signal of the node Nd15 into the ground voltage Vss according to the signal of the node Nd14; and inverters INV17, INV18 connected in series between the nodes Nd16, Nd17.

The operation of the noise elimination circuit in accordance with the present invention will now be explained.

Figure 6:
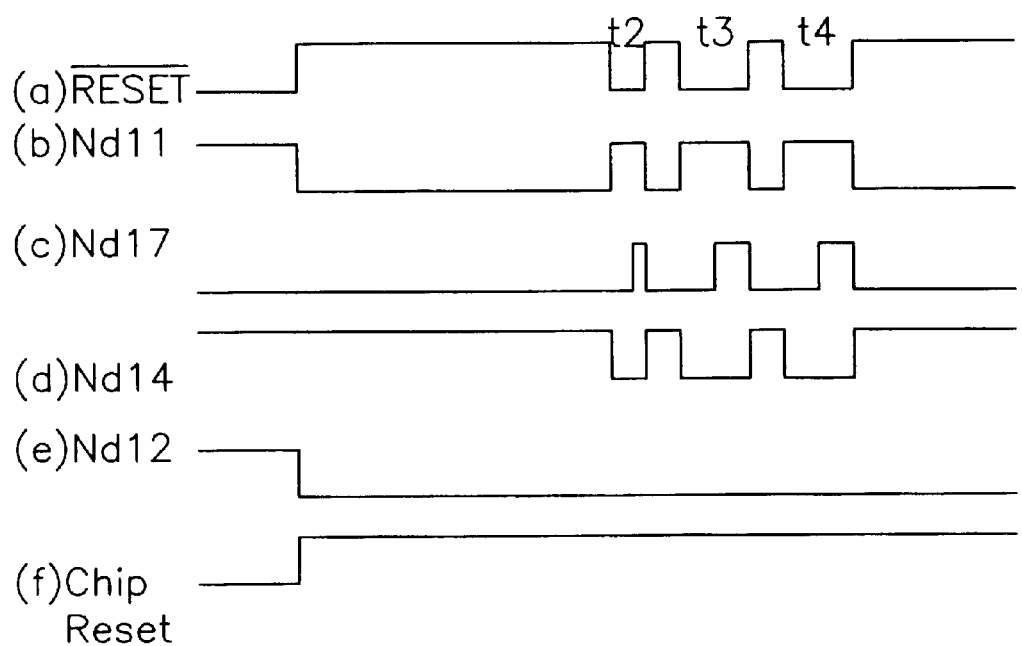
FIG. 6 is an operation timing diagram of the noise elimination circuit by nodes in accordance with the preferred embodiment of the present invention.

FIG. 6 is an operation timing diagram of the noise elimination circuit shown in FIG. 5 in accordance with the preferred embodiment of the present invention.

As shown in FIG. 6, when the reset bar signal /RESET is enabled at a low level and then disabled at a high level, the signal of the node Nd11, which is an input signal of the noise elimination unit 100, has an opposite signal to the input signal by the inverter INV11. That is, when the reset bar signal /RESET is disabled at a high level and noise t2–t4 is consecutively applied, the signal of the node Nd11 is also influenced.

When the signal of the node Nd11 has a high level, the ring oscillator unit 102 of the noise elimination unit 100 is operated to generate to the node Nd17 a pulse signal (FIG. 6(c)) having a predetermined period. Thereafter, the signal of the node Nd17 is frequency-divided through the frequency division circuit unit 104, thus outputting the frequency-divided pulse signal to the node Nd12. Here, the frequency-divided signal outputted to the node Nd12 is a signal enabled at a high level after a frequency division time t1 of the frequency division circuit unit 104. In addition, the high level signal of the node Nd12 and the high level signal of the node Nd11 reset the RS latch circuit unit 120 by the AND gate AND11, thereby generating the chip reset signal to the output terminal Q.

When the signal of the node Nd12 is enabled at a high level, the inverter INV16 of the ring oscillator unit 102 is turned off, and the NMOS transistor N11 is turned on, thus discharging the potential. Accordingly, the ring oscillator unit 102 is disabled.

Therefore, the output signal of the ring oscillator unit 102 is cleared. Here, the frequency division circuit unit 104 is not operated according to the signal of the node Nd13 (high), which is an inverted signal of the node Nd11, and maintains a current output state value. In order to re-operate the frequency division circuit unit 104, the signal of the node Nd12 must be cleared at a low level. In addition, the externally-inputted reset bar signal /RESET must be disabled at a high level. That is, the signal of the node Nd11 must be transited to a low level.

Here, the previous-operation value does not influence the current operation, by resetting the noise elimination unit 100 according to the reset bar signal /RESET.

The noise elimination circuit of the present invention clears the output signal of the ring oscillator unit 102 during a period where the reset bar signal /RESET has a high level (namely, the node Nd11 has a low level), and operates the ring oscillator unit 102 in a period where the reset bar signal /RESET has a low level (namely, the node Nd11 has a high level), thereby generating to the node Nd17 a pulse signal of a predetermined period. The frequency division circuit unit 104 receives the signal of the node Nd17, and outputs a signal enabled at a high level to the node Nd12 after the frequency division time t1.

Referring to FIG. 6, the input period of the noise t2–t4 applied to the reset bar signal /RESET is smaller than the frequency division time t1 of the frequency division circuit unit 104. As a result, the noise elimination circuit of the present invention includes the ring oscillator unit 102 for generating the pulse signal having a predetermined period in a low period of the reset bar signal /RESET, and frequency-divides the pulse signal from the ring oscillator unit 102 through the frequency division circuit unit 104, to eliminate the noise of the input signal.

In the noise elimination circuit shown in FIGS. 4 and 5, the ring oscillator unit 102 and the frequency division circuit unit 104 are designed to be reset at a high level period of the node Nd11 for applications to the low active signal.

In another embodiment of the present invention, the ring oscillator unit 102 and the frequency division circuit unit 104 may be reset at a low level period of the node Nd11 in order to be operated at a high active period of the input signal.

As discussed earlier, the noise elimination circuit in accordance with the present invention can adjust the period of the noise applied to the input signal smaller than the filtering time, by using the ring oscillator unit and the frequency division circuit unit, which prevents a misoperation of the circuit due to noise.

As the present invention may be embodied in several forms without departing from the spirit or essential characteristics thereof, it should also be understood that the above-described embodiment is not limited by any of the details of the foregoing description which are illustrative only, unless otherwise specified, but rather should be construed broadly within its spirit and scope as defined in the appended claims, and therefore all changes, alterations and modifications that fall within the meets and bounds of the claims, or equivalences thereof are intended to be embraced by the appended claims.

What is claimed is:

1. A noise elimination circuit comprising:

a ring oscillator unit for receiving first and second signals and generating a pulse signal according to the first signal, and stopping generation of the pulse signal when the first and the second signals have a first potential level; and a frequency division unit for receiving an output signal of the ring oscillator unit and then, N times frequency-dividing to generate the signal to the second signal, and being reset by the first signal.

2. The circuit according to claim 1, wherein the first potential is at a logic high level, and the second potential is at a logic low level.

3. The circuit according to claim 1, wherein the first potential is at a logic low level, and the second potential is at a logic high level.

4. The circuit according to claim 1, wherein the ring oscillator unit comprises:

a third inverter for inverting a signal of the first node, and outputting the inverted signal to a third node;

an OR gate for ORing the signals of the third node and the second node, and outputting the resultant signal to a fourth node;

a fourth inverter for inverting a signal of a fifth node according to the signal of the fourth node;

a resistor connected between the output terminal of the fourth inverter and a sixth node;

fifth and sixth inverters connected in series between the sixth node and the fifth node;

a capacitor connected between the fifth node and the sixth node;

an NMOS transistor for discharging a signal of the sixth node into the ground voltage according to the signal of the fourth node; and seventh and eight inverters connected in series between the fifth node and the seventh node.

5. The circuit according to claim 1, wherein the frequency division of the frequency division circuit unit is dependent upon the structure of the ring oscillator unit.

6. A noise elimination circuit comprising:

a first inverter receiving a reset bar signal, and outputting an inverted signal to a first node;

a noise elimination unit receiving the signal of the first node, eliminating all noise of the signal, and outputting the resultant signal to a second node;

a second inverter inverting the signal of the first node;

an AND gate ANDing the signal of the first node and the signal of the second node; and an RS latch circuit unit receiving the output signal from the second inverter as a set signal and the output signal from the AND gate as a reset signal, and generating a chip reset signal to an output terminal.

7. The circuit according to claim 6, wherein the noise elimination unit comprises:

a ring oscillator unit generating a pulse signal having a predetermined period when the signal of the first node is at a first potential, and stopping the operation and clearing an output signal thereof, when the signal of the second node is at the first potential; and a frequency division circuit unit frequency-dividing the output signal from the ring oscillator unit, outputting the frequency-divided signal to the second node, and being reset when the signal of the first node is at the second potential.

8. The circuit according to claim 7, wherein the first potential is at a logic high level, and the second potential is at a logic low level.

9. The circuit according to claim 7, wherein the first potential is at a logic low level, and the second potential is at a logic high level.

10. The circuit according to claim 7, wherein the ring oscillator unit comprises:

a third inverter for inverting the signal of the first node, and outputting the inverted signal to a third node;

an OR gate for ORing the signals of the third node and the second node, and outputting the resultant signal to a fourth node;

a fourth inverter for inverting a signal of a fifth node according to the signal of the fourth node;

a resistor connected between the output terminal of the fourth inverter and a sixth node;

fifth and sixth inverters connected in series between the sixth node and the fifth node;

a capacitor connected between the fifth node and the sixth node;

an NMOS transistor for discharging a signal of the sixth node into the ground voltage according to the signal of the fourth node; and seventh and eight inverters connected in series between the fifth node and the seventh node.

11. The circuit according to claim 7, wherein the frequency division of the frequency division circuit unit is dependent upon the design of the ring oscillator unit.

* * * * *